United States Patent
Wong et al.

(10) Patent No.: US 8,619,267 B2
(45) Date of Patent: Dec. 31, 2013

(54) PROXIMITY SENSOR WITH MOTION DETECTION

(75) Inventors: Chee Heng Wong, Singapore (SG); Yufeng Yao, Singapore (SG); Han Kang Chong, Singapore (SG)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 355 days.

(21) Appl. No.: 13/178,665

(22) Filed: Jul. 8, 2011

(65) Prior Publication Data

US 2013/0010310 A1  Jan. 10, 2013

(51) Int. Cl.
*G01B 11/14* (2006.01)

(52) U.S. Cl.
USPC ...................................... 356/623; 356/615

(58) Field of Classification Search
USPC ............ 356/237.1–241.6, 242.1–243.8, 356/426–431, 600–640
See application file for complete search history.

(56) References Cited

U.S. PATENT DOCUMENTS

| | | | |
|---|---|---|---|
| 5,748,321 A * | 5/1998 | Burks et al. | 356/635 |
| 5,874,732 A | 2/1999 | Giles | |
| 7,301,140 B2 * | 11/2007 | Burgschat et al. | 250/231.13 |
| 7,671,972 B2 | 3/2010 | Cheng et al. | |
| 7,701,567 B2 * | 4/2010 | Chow | 356/218 |
| 2008/0192234 A1 * | 8/2008 | Lapstun et al. | 356/72 |
| 2009/0101804 A1 | 4/2009 | Phan Le | |
| 2011/0168874 A1 | 7/2011 | Phan Le | |

FOREIGN PATENT DOCUMENTS

JP    2008-8849    1/2008

* cited by examiner

*Primary Examiner* — Gregory J Toatley
*Assistant Examiner* — Jarreas C Underwood (57) ABSTRACT

A proximity sensor with movement detection is provided. The proximity sensor may include an ASIC chip; at least three light sources configured to emit light in a particular sequence; and a photo detector configured to receive light and generate an output signal. The proximity sensor may have a compact size package, wherein the photo detector may be stacked on the ASIC chip and disposed at a substantially equal distance from the at least three light sources. The proximity sensor includes a driver operable to generate a current to a plurality of light sources in a particular timing sequence, a photo detector configured to receive light and generate an output signal, an ASIC configured to report the movement of an object near the proximity sensor if the output signal pattern generated matches one of the output signal patterns from among a set of known output signal patterns. The proximity sensor may be configured to be used as a counter or an on/off switch based on particular movements detected.

12 Claims, 10 Drawing Sheets

PROXIMITY SENSOR WITH MOTION DETECTION

BACKGROUND

Proximity sensors are conventionally used to detect the presence of an object without any physical contact. A typical proximity sensor comprises a light source to emit light and a photo detector to detect light reflected by an object that is within a predetermined proximity of the sensor.

Proximity sensors have been widely used in many devices and also for many industrial applications. For example, in an automated production assembly line, proximity sensors are used to detect the position of a machine component in the production line and also for counting of parts produced by a production tool. Whereas in the robotics industry; the proximity sensor may be used to monitor a robot's position and control the movements of the robot. The proximity sensor is also commonly used as an electronic switch to open and close an electrical circuit when an object is detected by the sensor. More recently, optical proximity sensors have been widely employed in portable electronic devices, such as a portable handheld device, mobile phone and portable computers.

In general, a proximity sensor comprises an invisible light source and a photo detector. When an object comes within a predetermined distance of the sensor, the object reflects the light from the light source toward the photo detector. After sensing the reflected light, the photo detector subsequently sends an output signal, indicating the presence of an object. Typically, an action is performed in response to the output signal, such as turning on water, opening a door, etc. Thus, the conventional proximity sensors are utilized merely to facilitate the detection of an object within a predetermined proximity of the sensor. Despite the ability to detect objects without any physical contact, conventional proximity sensors are not utilized as part of an input device or contactless smart control system. Thus, the use of proximity sensors in electronic devices has heretofore been limited to merely performing the dedicated function of proximity sensing.

In conventional design, in order to provide movement detection or an X-Y direction motion sensing function to a proximity sensing device, a dedicated X-Y motion detecting device has to be integrated along with a proximity sensor. As a result, this increases the cost and also the overall size of the device because more space is needed to accommodate two separate systems. Accordingly, it would be desirable to provide a single device or system that is functionally capable of providing proximity sensing operations, as well as X-Y directions motion sensing operations.

BRIEF DESCRIPTION OF THE DRAWINGS

Throughout the description and figures, similar reference numbers may be used to identify similar elements.

DETAILED DESCRIPTION

Figure 1:
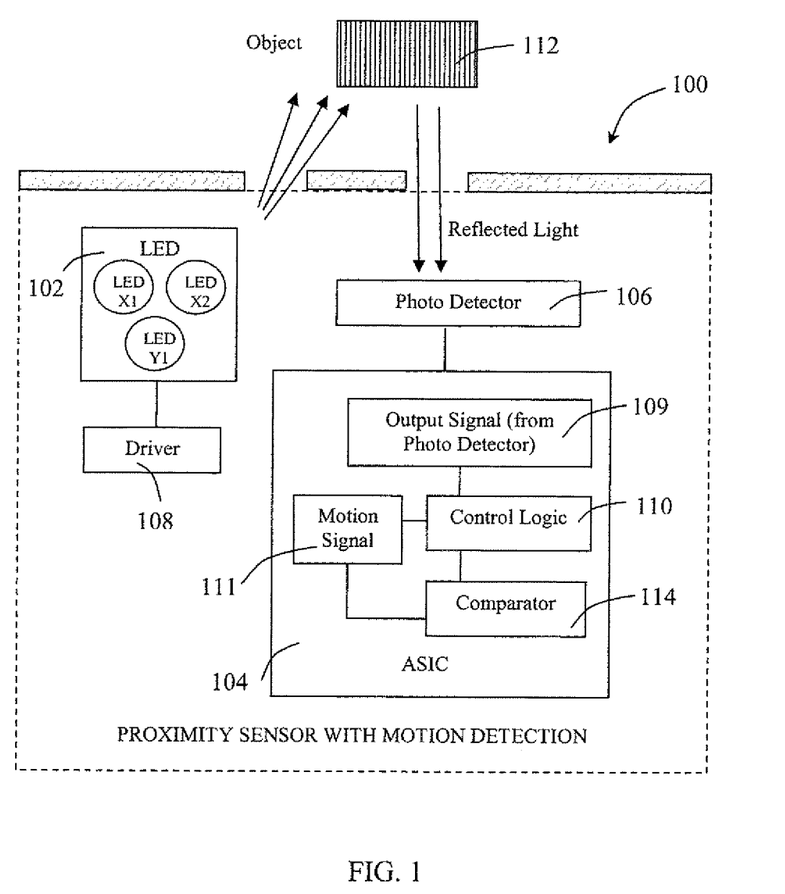
FIG. 1 is a block diagram of a proximity sensor with movement detection.

Proximity sensors are particularly useful for detecting the presence of an object without the need for physical contact. FIG. 1 is a block diagram of a proximity sensor with movement detection. The proximity sensor 100 and corresponding motion detection function for providing navigation operation are described in more detail below and various embodiments of the invention are shown in FIG. 1 to FIG. 11. However, it is to be understood that other embodiments may be modified without departing from the scope of the present invention. For example, the proximity sensor may be modified to provide additional input functions, such as an additional function for manipulating a cursor and scrolling or providing a mouse clicking event function. In such an instance, a navigation engine (not shown) may be incorporated with the proximity sensor to convert the movement detection signals generated by the proximity sensor into navigation input functions.

The proximity sensor 100 includes a plurality of light sources or LED 102, an ASIC (application specific integrated circuit) chip 104 and a photo detector 106. The proximity sensor 100 may further include a driver 108 coupled the LED 102, configured to generate a drive current with a predetermined timing sequence. The LED 102 may be configured to emit light in response to an applied current having a particular timing or under a certain sequence. The LED 102 may be any suitable source of infrared (IR) LED, which is capable of emitting light at a desirable wavelength and intensity. The selection of the LED 102 may vary depending on the application; and also on its ability to provide the required intensity in producing an optimum light reflection on to the photo detector 106. As shown herein below, LED 102 may include LED $X_1$, LED $X_2$, and LED $Y_1$. Other combinations are possible, such as $Y_2$.

The photo detector 106 is operable to receive light and generate an output signal 109 in response. In general, a photo detector 106 may convert light or electromagnetic radiation that strikes it into a current. For simplicity, throughout this specification, the electromagnetic radiation (or output signal 109) may be referred to simply as the light and the current generated by the photo detector 106, in response to the light it receives. In an operational embodiment, if there is an object 112 placed near the proximity sensor 100, the light emitted by the LED 102 may be reflected toward the photo detector 106 and subsequently cause the photo detector 106 to generate an output signal 109 in response. Therefore, the output signal 109 may be expected to contain a signal profile that corresponds to the sequence of the light emitted by the LED 102. Conversely, if there is no object present to reflect the light emitted by the LED 102, the incident light, if any, received by the photo detector 106 may be from other sources, and this leads to the generation of a different kind or unknown output signal profile, which may be ignored or canceled subsequently by the system.

In one embodiment, the ASIC chip 104 may be coupled with the photo detector 106, configured to receive the output signal 109 from the photo detector 106. The ASIC chip 104 includes control logic 110 and a comparator 114. In one embodiment, the control logic 110 may be configured to process the output signal 109 to generate a motion signal 111. The comparator 114 may be configured to receive the motion signal 111 and to report a movement upon determining the presence of a predetermined profile in the motion signal 111. In one embodiment, the predetermined profile may include a profile of a motion signal 111 generated by the control logic 110 in correspondence to certain movements of an object 112 over the proximity sensor 100. In one embodiment, when the object 112 moves over the proximity sensor 100 in a particular direction, a motion signal 111 having a specific signal profile may be generated by the control logic 110 to represent that particular movement. For example, when the object 112 moves along the X-axis or horizontal axis over the proximity sensor 100, the control logic 110 may process the output signal 109, generated by the photo detector 106 and produce a unique motion signal profile in correspondence to that horizontal movements. Hence, a set of predetermined motion signal profiles may be created accordingly by exposing the proximity sensor 100 to various predetermined object movement. The set of predetermined or known motion signal 111 profiles may include a horizontal movement output signal profile, which represents a horizontal movement of an object 112 along the X-axis over the proximity sensor 100. A vertical movement motion signal 111 profile may represent a vertical movement of an object 112 along the Y-axis. Therefore, in a situation where a signal profile 111 generated by the control logic 110 matches one of the predetermined profiles from among a set of known motion signal profiles, the associated type of object movement may be immediately identified.

Figure 2:
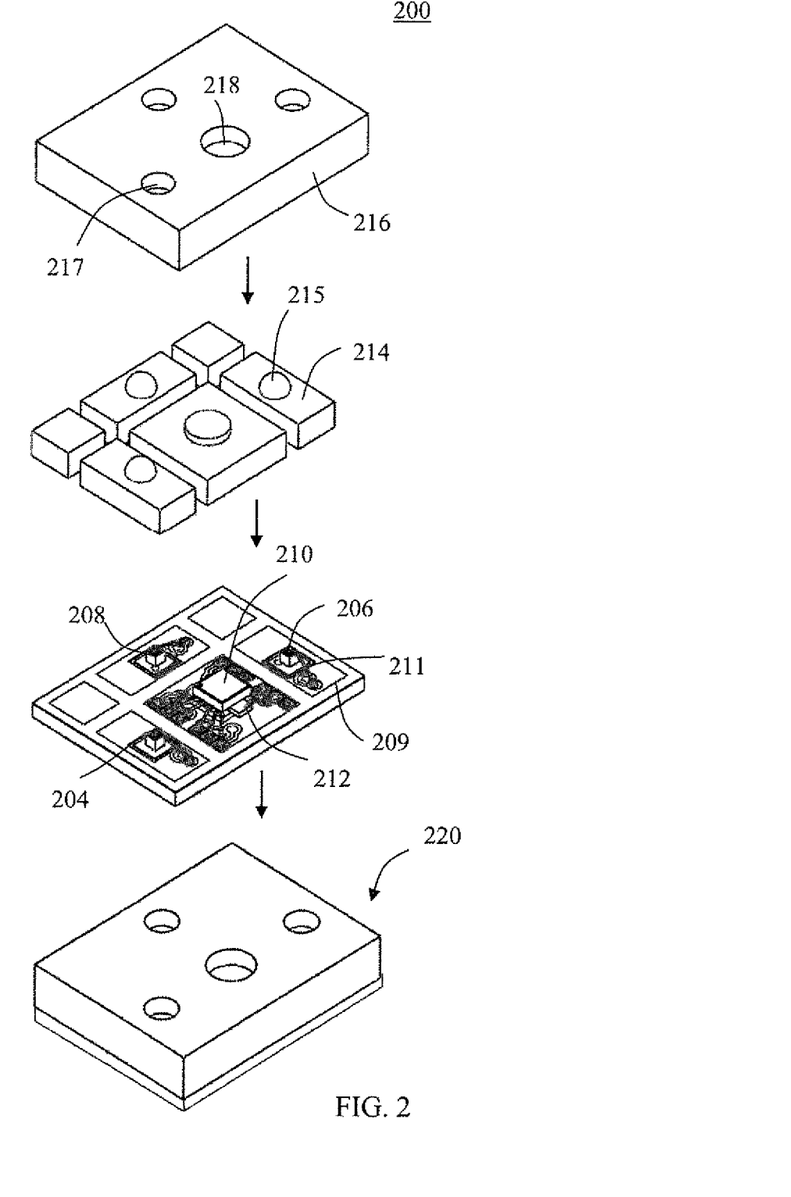
FIG. 2 is a perspective exploded view of a proximity sensor.

FIG. 2 is a perspective exploded view of a proximity sensor 200. The proximity sensor 200 may include three infrared LEDs 204, 206, 208, namely $X_1$, $X_2$, and $Y_1$, respectively; and a photo detector 210 disposed on a PCB 209. The LEDs (204-208) and the photo detector 210 may be electrically connected to the PCB 209 by one or more wire bonds 211. In one embodiment, the LEDs (204-208) are disposed adjacent to three sides of the proximity sensor in a triangular pattern, whereas the photo detector 210 is disposed at a substantially equal distance from the LEDs (204-208). The proximity sensor 200 may include an ASIC chip 212 stacked below the photo detector 210. Other physical layouts of the LEDs, photodetectors and ASIC are anticipated. The proximity sensor 200 may also include an epoxy material 214 encapsulating the LEDs (204-208), the ASIC chip 212 and the photo detector 210. The epoxy material 214 may be a clear epoxy material configured to provide protection to these components and the wire bonds by any known molding process. The epoxy material 214 may further include a plurality of lens 215 for light focusing. In one embodiment, the proximity sensor 200 may include a cover 216 made of a mold compound disposed over the epoxy material 214 to form the package 220. The cover 216 may include a plurality of LED apertures 217 located above each of the LEDs (204-208) and a photo detector aperture 218 above the photo detector 210, respectively. The light emitted by the LEDs (204-208) may pass through the LED apertures 217 towards the object (not shown) to be detected. After the light is reflected by an object (not shown) in close proximity with the proximity sensor 200, it may subsequently pass through the photo detector aperture 218 towards the photo detector 210, where it may be detected.

Figure 3:
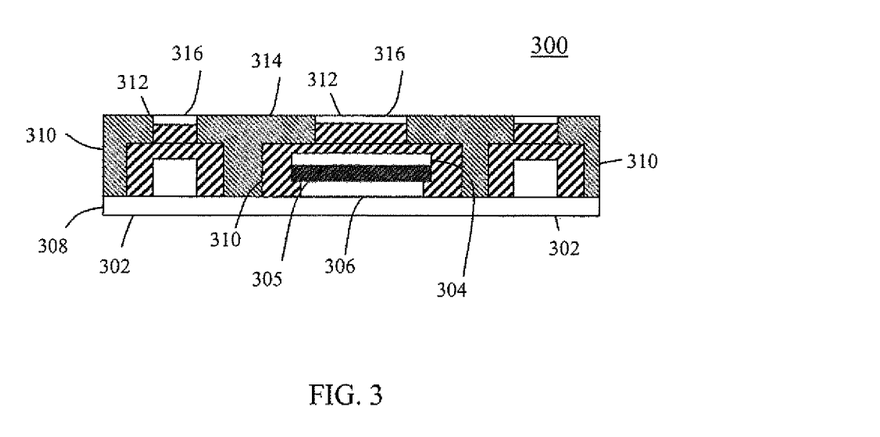
FIG. 3 is a cut-away view of a proximity sensor package.

FIG. 3 is a cut-away view of a proximity sensor package 300. The proximity sensor package 300 includes a plurality of LEDs 302, a photo detector 304 and an ASIC chip 306 disposed on and electrically connected to a PCB 308 by one or more wire bonds (not shown). In one embodiment, the photo detector 304 is stacked on the ASIC chip 306 and separated from the ASIC chip 306 by a spacer 305. The spacer 305 may be configured to insulate the ASIC chip 306 from the photo detector 304. The proximity sensor 300 may also include a transparent or a clear mold compound 310 for encapsulating the LEDs 302, the ASIC chip 306 and the photo detector 304 together on the PCB 308 as well as to protect the wire bonds (not shown). The mold compound may be accomplished by any suitable molding process. For example, the clear mold compound 310 may be molded over the LEDs 302, the ASIC chip 306 and the photo detector 304 by a conventional injection molding process. The clear mold compound 310 may be any suitable molding material. For example, the clear mold compound 310 may be manufactured by Nitto Denko having a part number NT8506. However, other transparent compounds, such as a transparent epoxy resin may also be used. In one embodiment, the clear mold compound 310 may further include a lens 312 disposed on the clear mold compound 310 for directing light towards the photo detector 304. In an alternative embodiment, the lens 312 may also be formed simultaneously under the same molding process when the proximity sensor is being molded with the clear mold compound 310.

The proximity sensor 300 may also include a cover 314 made of a mold compound disposed over the clear mold compound 310 to form the proximity sensor package 300 by a conventional injection molding process. The cover 314 may include a plurality of apertures 316 above the LEDs 302 and the photo detector 304.

In one embodiment, the photo detector 304 may be stacked on the ASIC chip 306, so as to reduce the size of the package to produce an ultra-compact package. The overall thickness of the proximity sensor 300 may be limited by the thickness of the moldability of the cover 314 to faun the package 300. For example, the proximity sensor 300 may have a rectangular package shape with dimensions in the X-Y plane 6 mm×4 mm and a thickness or a z-height of 1.5 mm.

Figure 4:
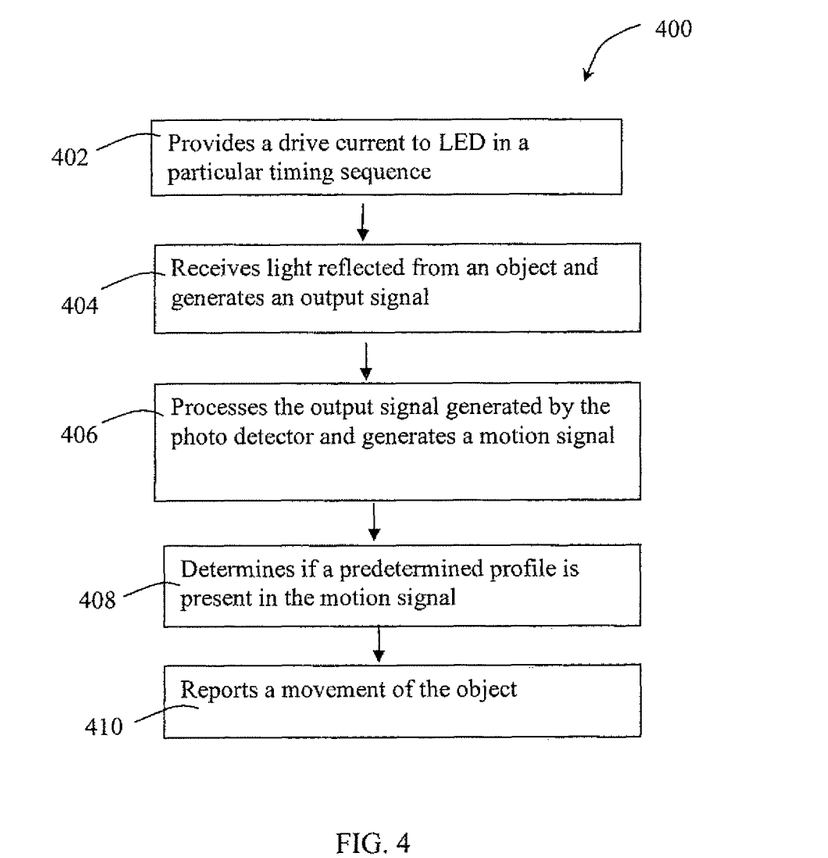
FIG. 4 illustrates a flow chart of a method for movement detection.

FIG. 4 illustrates a flow chart of one embodiment of a method for movement detection. At block 402, the driver provides a drive current to an LED in a particular timing sequence and causes the LED to emit light with a distinct characteristic. At block 404, the photo detector receives the light reflected from an object, if present, and generates an output signal in response to the light received. At block 406, the ASIC chip, or more specifically, the control logic of the ASIC chip processes the output signal generated by the photo detector, and subsequently, generates a motion signal. At block 408, the comparator determines if a predetermined profile of the motion signal is present in the motion signal generated by the control logic. The predetermined profile is a profile of a motion signal generated by the control logic in correspondence to a certain movement of an object over the proximity sensor. At block 410, the comparator reports a movement of the object upon determining the presence of a predetermined profile in the motion signals generated by the control logic. Therefore, when an object moves over the proximity sensor in a particular direction, the light generated by the LED may be reflected towards the photo detector. Hence the profile of the motion signal generated may be expected to have a similar profile as the motion signal profile that represents the particular movement of the object.

Figure 5:
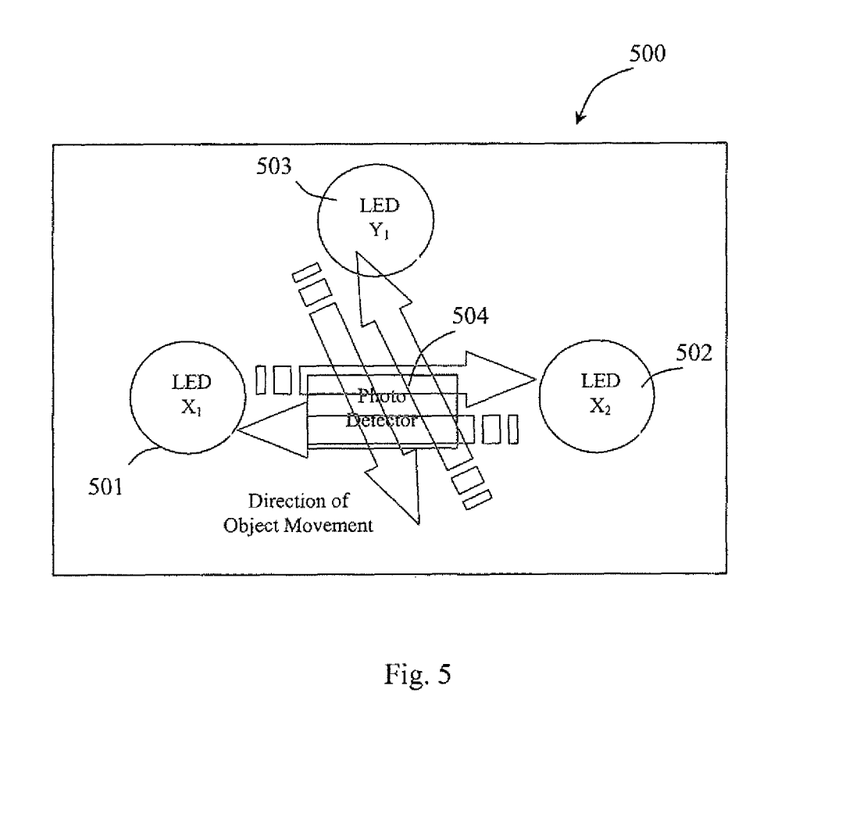
FIG. 5 is a schematic diagram of a proximity sensor with three LEDs.

FIG. 5 is a schematic diagram illustrating a proximity sensor 500 with three LEDs 501, 502 and 503, namely $X_1$, $X_2$, $Y_1$, respectively, and a photo detector 504. The arrows in FIG. 5 illustrate the direction of object movement over the proximity sensor 500. However, the directions of movement that are more diagonal in nature are also able to be detected, as the light detected from one LED or another will be stronger or weaker. The operation of the proximity sensor of FIG. 5 will be discussed in conjunction with FIG. 1. In one embodiment, the proximity sensor 500 may include a driver 108 coupled with the LEDs 501, 502 and 503 configured to drive the LEDs to emit light in a particular timing or under a certain sequence. For example, the driver 108 may provide current to $X_1$ 501 first followed by $X_2$ 502 and subsequently $Y_1$ 503, for a duration of one millisecond (ms) each. Thus, at any given instant in time, only one of the LEDs 501-503 is lit up and enabled for 1 ms. As the LED is configured to emit light with a known characteristic, if there is an object 112 nearby to reflect the light back towards the photo detector 504, the photo detector 504 is therefore, expected to subsequently convey a set of output signals exhibiting the same characteristic as well. Details of the characteristics for each of the output signals 109 will be discussed in more detail in the form of wave diagrams below with reference to FIGS. 6-9.

Figure 6:
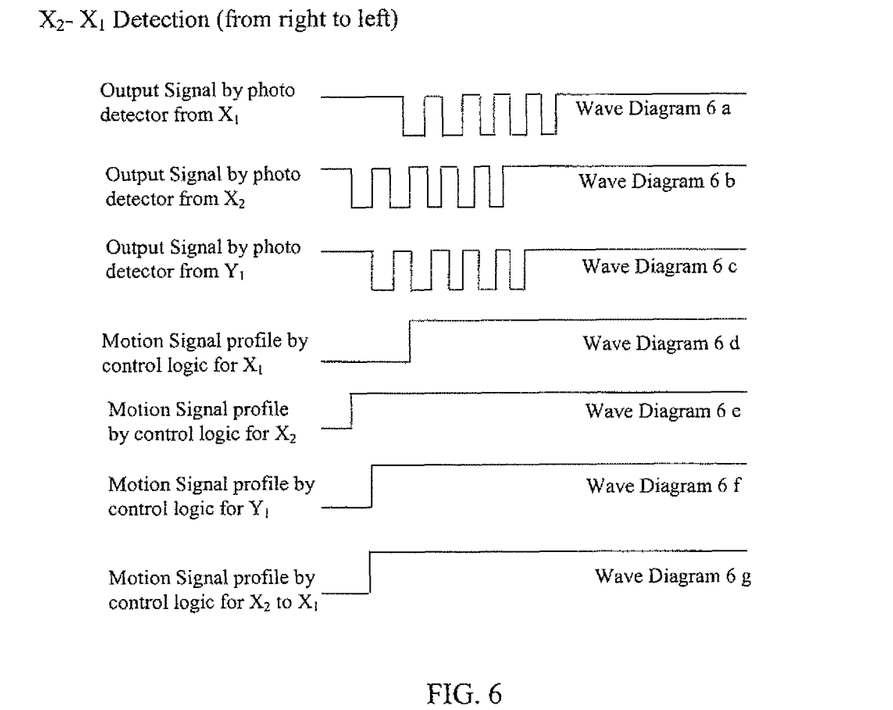
FIG. 6 illustrates wave diagrams representing the detection of a movement of an object from right to left over the proximity sensor.

Embodiments described in FIGS. 6-9 will be discussed in conjunction with FIG. 5. Specifically, FIG. 6 illustrates wave diagrams of an output signal profile representing the detection of a movement of an object over the proximity sensor 500 as illustrated in FIG. 5, with the object moving in the direction from LED $X_2$-$X_1$ or from right to left. When an object moves over LED $X_2$ 502 to LED $X_1$ 501, and also LED $Y_1$ from right to left over the proximity sensor 500, the light emitted by the LEDs may be reflected by the object 112 and strike the photo detector 504, causing the photo detector 504 to generate output signals, as shown in wave diagrams 6a, 6b and 6c, respectively. The control logic 110 may subsequently process these output signals 109 (shown in wave diagram 6a to 6c), generated by the photo detector 106 to subsequently produce motion signal profiles, as shown in wave diagrams 6d to 6f, respectively. The control logic 110 may then combine these motion signals and finally generate a motion signal profile representing the right to left horizontal movement of the object over the proximity sensor 500, as shown in wave diagram 6g in FIG. 6.

Figure 7:
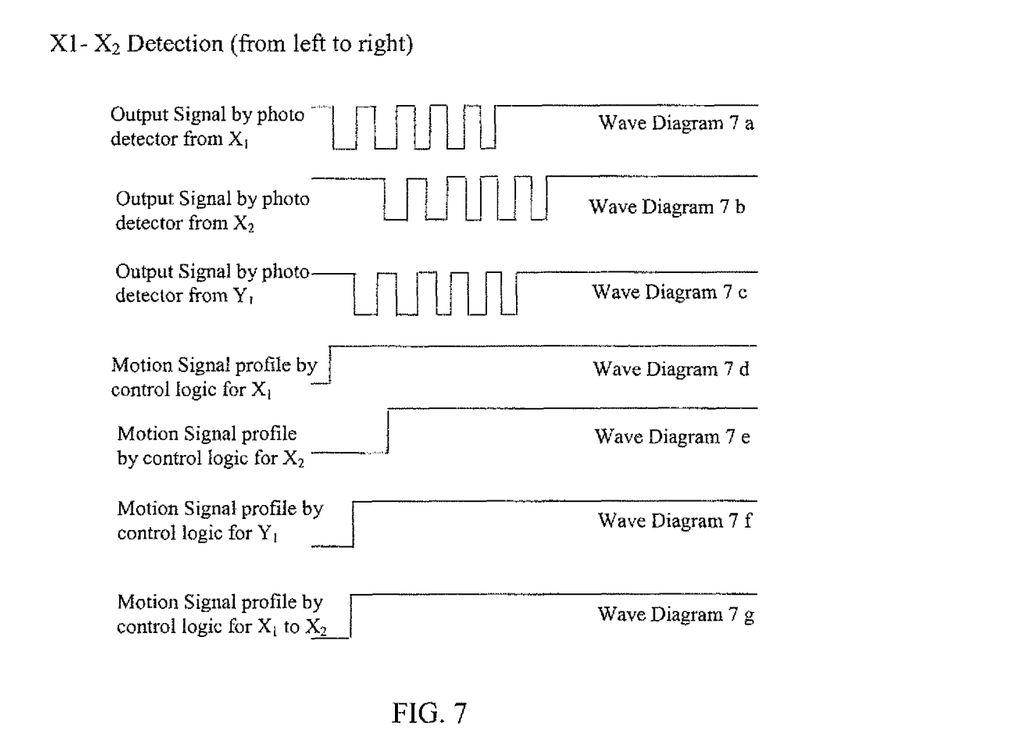
FIG. 7 illustrates wave diagrams representing the detection of a movement of an object from left to right over the proximity sensor.

FIG. 7 illustrates wave diagrams of an output signal profile representing the detection of a movement of an object over the proximity sensor 500, as shown in FIG. 5 with the object moving in the direction from LED $X_1$-LED $X_2$ or from left to right. When an object moves over LED $X_1$ 501 to LED $X_2$ 502, and also LED $Y_1$ from left to right over the proximity sensor 500 as shown in FIG. 5, the light emitted by the LEDs may be reflected by the object 112 and strike the photo detector 504, causing the photo detector 504 to generate output signals, as shown in wave diagrams 7a, 7b and 7c, respectively, in FIG. 7. The control logic 110 may subsequently process these output signals 109 (shown in wave diagram 7a to 7c), generated by the photo detector 106 to produce motion signal profiles, as shown in wave diagrams 7d to 7f, respectively. The control logic 110 may then combine these motion signals and finally generate a motion signal profile representing the left to right horizontal movement of the object over the proximity sensor 500, as shown in wave diagram 7g in FIG. 7.

Figure 8:
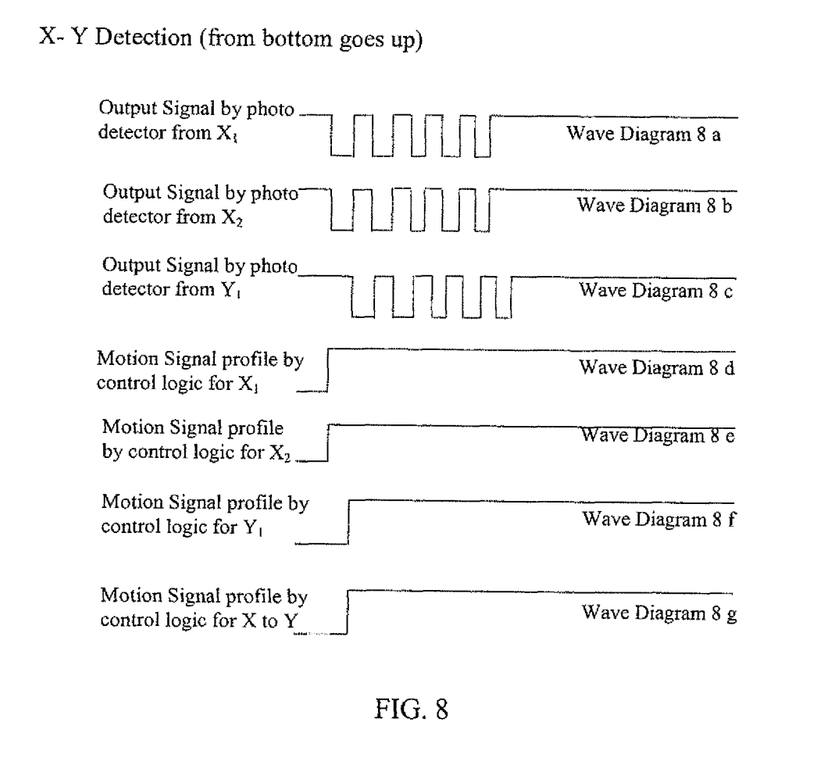
FIG. 8 illustrates wave diagrams representing the detection of a movement of an object from bottom goes up vertically over the proximity sensor.

FIG. 8 illustrates wave diagrams of an output signal profile representing the detection of a movement of an object over the proximity sensor 500, as shown in FIG. 5 with the object moving in the direction from X to Y or moving up vertically from the bottom. When an object moves over say LED $X_1$ 501 or LED $X_2$ 502, and also LED $Y_1$ from bottom goes up over the proximity sensor 500 as shown in FIG. 5, the light emitted by the LEDs may be reflected by the object 112 and strike the photo detector 504, causing the photo detector 504 to generate output signals, as shown in wave diagrams 8a, 8b and 8c, respectively, in FIG. 8. The control logic 110 may subsequently process these output signals 109 (shown in wave diagram 8a to 8c), generated by the photo detector 106 to produce motion signal profiles, as shown in wave diagrams 8d to 8f, respectively. The control logic 110 may then combine these motion signals and finally generate a motion signal profile representing the bottom to top vertical movement of the object over the proximity sensor 500, as shown in wave diagram 8g in FIG. 8.

Figure 9:
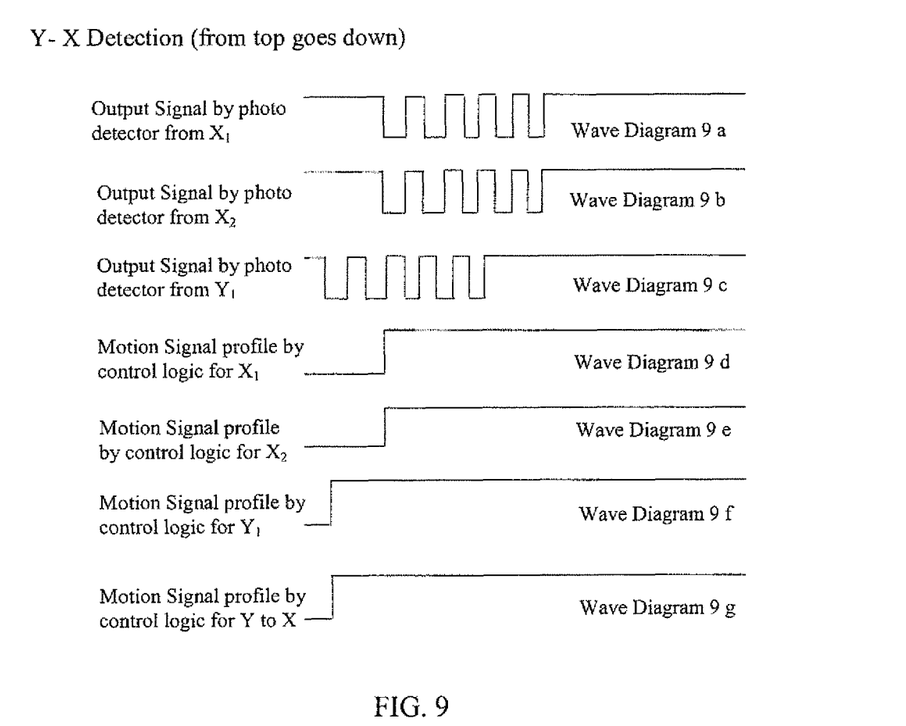
FIG. 9 illustrates wave diagrams representing the detection of a movement of an object from top goes down vertically over the proximity sensor.

FIG. 9 illustrates wave diagrams of an output signal profile representing the detection of a movement of an object over the proximity sensor 500, as shown in FIG. 5 with the object moving in the direction from Y to X or moving vertically down from the top toward the bottom. When an object moves over say LED $X_1$ 501 or LED $X_2$ 502, and also LED $Y_1$ from top goes down over the proximity sensor 500 as shown in FIG. 5, the light emitted by the LEDs may be reflected by the object 112 and strike the photo detector 504, causing the photo detector 504 to generate an output signal, as shown in wave diagrams 9a, 9b and 9c, respectively, in FIG. 9. The control logic 110 may subsequently process these output signals 109 (shown in wave diagram 9a to 9c), generated by the photo detector 106 to produce motion signal profiles, as shown in wave diagrams 9d to 9f, respectively. The control logic 110 may then combine these motion signals and finally generate a motion signal profile representing the top goes down vertical movement of the object over the proximity sensor 500, as shown in wave diagram 9g in FIG. 9.

Figure 10:
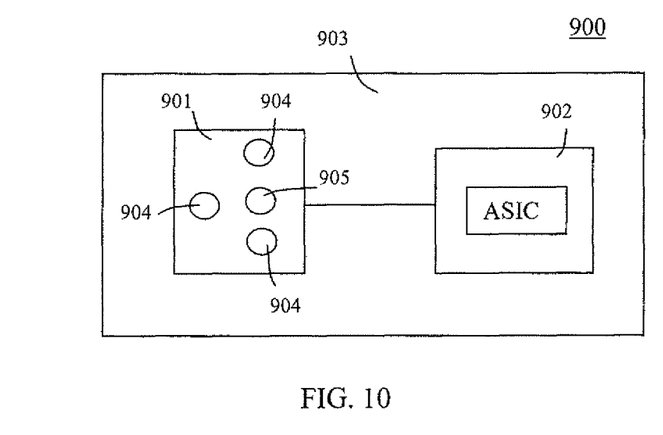
FIG. 10 is a block diagram of a proximity sensor with a sensor module and ASIC chip.

FIG. 10 is a block diagram illustrating a proximity sensor 900 having a sensor module 901 coupled with an external ASIC chip. In an alternative embodiment, the proximity sensor 900 may include a sensor module 901 coupled with an external controller module 902, which may include an ASIC chip. The sensor module 901 and controller module 902 may be two separate components disposed on a printed circuit board (hereinafter PCB 903). As described previously in FIG. 2, the sensor module 901 may further include at least three light sources 904 configured to emit light and a photo detector 905 configured to receive light and generate an output signal. The LEDs 904 may be disposed adjacent to three sides of the sensor module 902 in a triangular pattern, whereas the photo detector 905 may be disposed at a substantially central location, substantially equal distance from each of the LEDs 902. The controller module 902 may be coupled with an external ASIC chip or a standard IC or any microcontroller, which may be programmable. Alternatively, for certain applications, the sensor module 901 and the controller 902 may also be disposed on two completely different systems far away from each other instead on a single PCB.

Figure 11:
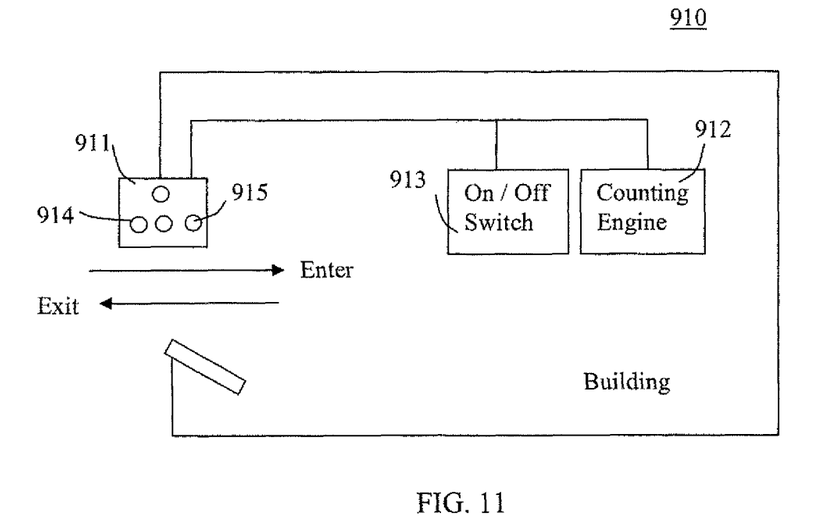
FIG. 11 illustrates a schematic block diagram of an application of a proximity sensor.

FIG. 11 illustrates a schematic block diagram of an application of a proximity sensor. In one embodiment, a proximity sensor 910 may be deployed as a movement sensor to detect the movement of people in and out of a building. In this embodiment, the proximity sensor 911 may be coupled with a counting engine 912 or a counter configured to count and register the flow of people going into and out of the building. For example, this proximity sensor 910 may be disposed at an entrance of the building to detect movement of people going in and out through a door or entryway. In one embodiment, when a person moves over the proximity sensor 911 in the direction, for example from LED $X_1$ 914 to LED $X_2$ 915, entering into the building, a motion signal may be generated by the proximity sensor 911 to indicate an entry of a person into the building. On the other hand, when a person moves over the proximity sensor in an opposition direction, for example from LED $X_2$ 915 to LED $X_1$ 914, out of the building, a motion signal may be generated by the proximity sensor 911 to indicate an exit of a person from the building. Hence, when coupled with a counting engine 912, the proximity sensor 911 may be configured to operate as a counting device to detect the number of occupants in or on the premises at any one time. In an alternate embodiment, the proximity sensor 911 may also be implemented as an on/off switch for operating a number of devices if operated under the same working principles. For example, the proximity sensor 911 may be configured to switch on the light upon the detection of a person's movement over the proximity sensor 911 in the direction from LED $X_1$ 914 to LED $X_2$ 915, when entering into the building. Likewise, it may used to switch off the light when a reverse movement has been detected, assuming a counting engine has decremented to zero occupants.

Although specific embodiments of the invention have been described and illustrated, the invention is not to be limited to the specific forms or arrangements of parts so described and illustrated. For example, multiple proximity sensors 911 may be utilized with multiple doors or entrances to a building or premises, such as an amusement park, museum, theatre, auditorium, athletic stadium, or other similar venue. In this embodiment, the counters of the multiple proximity sensors 911 may be added together. Other trigger events may also be an alarm. The scope of the invention is to be defined by the claims appended hereto and their equivalents.

What is claimed is:

1. A proximity sensor with movement detection comprising:
    an ASIC chip;
    at least three light sources configured to emit light in a predetermined sequence; and
    a photo detector configured to receive light and generate an output signal;
    wherein the photo detector is stacked on the ASIC chip and disposed at a substantially equal distance from the at least three light sources;
    wherein the ASIC chip comprises a comparator configured to report a movement upon determining the presence of a predetermined profile in the motion signal, wherein the predetermined profile is a profile of a motion signal generated by the control logic in correspondence to a certain movement of an object over the proximity sensor;
    wherein the comparator is configured to report a movement if the profile of the motion signal generated by the control logic matches one of the predetermined profiles from among a set of known motion signal profiles; and
    wherein the known motion signal profiles comprise horizontal and vertical motion signal profiles corresponding to movements of an object along the X-axis and the Y-axis over the proximity sensor, respectively.

2. The proximity sensor of claim 1, wherein the ASIC chip comprises control logic coupled to the photo detector and configured to process the output signal to generate a motion signal.

3. The proximity sensor of claim 1, wherein the at least three light sources are disposed adjacent to three sides of the proximity sensor in a triangular pattern.

4. The proximity sensor of claim 1, further comprising an epoxy material for encapsulating the light sources, the ASIC and the photo detector, and a casing for covering the epoxy material to form a package.

5. The proximity sensor of claim 1, further comprising an insulating spacer disposed between the ASIC chip and the photo detector.

6. A proximity sensor with movement detection comprising:
    a sensor module comprises at least three light sources configured to emit light and a photo detector configured to receive light and generate an output signal; and
    a controller module coupled to the sensor module comprising control logic and a comparator;
    wherein the comparator is configured to report a movement upon determining the presence of a predetermined profile in the motion signal, wherein the predetermined profile is a profile of a motion signal generated by the control logic in correspondence to a certain movement of an object over the sensor module;
    wherein the comparator is configured to report a movement if the profile of the motion signal generated by the control logic matches one of the predetermined profiles from among a set of known motion signal profiles; and
    wherein the known motion signal profiles comprise horizontal and vertical motion signal profiles corresponding to movements of an object along the X-axis and the Y-axis over the sensor module, respectively.

7. The proximity sensor of claim 6, wherein the at least three light sources are disposed adjacent to three sides of the sensor module in a triangular pattern.

8. The proximity sensor of claim 6, wherein the control logic is coupled to the photo detector configured to process the output signal to generate a motion signal.

9. The proximity sensor of claim 6, further comprising an epoxy material covering the at least three light sources and photo detector, and a casing covering the epoxy material to form a sensor module package.

10. A detector comprising:
    a sensor module comprising a plurality of light sources configured to emit light and a photo detector configured to receive light and generate an output signal;
    a controller coupled to the sensor module and comprising control logic and a comparator;
    a counting engine coupled to the controller configured to register predetermined movements of an object;
    wherein the sensor module comprises at least three light sources disposed adjacent to three sides of the sensor module in a triangular pattern; and
    a substantially clear epoxy material covering the at least three light sources and forming a lens over each of the at least three light sources and a casing covering the epoxy material to form a detector package, wherein the detector package comprises apertures over the at least three light sources and the photo detector.

11. The detector of claim 10, wherein the control logic is coupled to the photo detector and configured to process the output signal and generate a detection signal in correspondence to a movement of an object over the sensor module.

12. The detector of claim 11, wherein the counting engine is configured to receive the detection signal to register a movement.

* * * * *